United States Patent
Sandstrom et al.

(10) Patent No.: US 9,090,095 B2
(45) Date of Patent: Jul. 28, 2015

(54) OPTICAL WRITER FOR FLEXIBLE FOILS

(71) Applicant: Micronic Mydata AB, Taby (SE)

(72) Inventors: Torbjorn Sandstrom, Pixbo (SE); Carl During, Taby (SE)

(73) Assignee: Micronic Mydata AB, Täby (SE)

( * ) Notice: Subject to any disclaimer, the term of this patent is extended or adjusted under 35 U.S.C. 154(b) by 0 days.

(21) Appl. No.: 13/909,529

(22) Filed: Jun. 4, 2013

(65) Prior Publication Data
US 2013/0335504 A1 Dec. 19, 2013

Related U.S. Application Data

(60) Provisional application No. 61/655,411, filed on Jun. 4, 2012, provisional application No. 61/777,144, filed on Mar. 12, 2013.

(51) Int. Cl.
| | |
|---|---|
| *B41J 2/435* | (2006.01) |
| *B41J 2/47* | (2006.01) |
| *G03F 7/20* | (2006.01) |
| *G03F 9/00* | (2006.01) |

(52) U.S. Cl.
CPC ............. *B41J 2/47* (2013.01); *G03F 7/2002* (2013.01); *G03F 7/2051* (2013.01); *G03F 7/70816* (2013.01); *G03F 9/00* (2013.01)

(58) Field of Classification Search
CPC ............. B41J 1/00; B41J 1/16; B41J 1/20; B41J 1/26; B65H 5/085; B65H 5/22; B65H 5/228; B65H 20/10
USPC ............. 347/227, 242, 245, 257, 262–264; 242/417.2, 419.3
See application file for complete search history.

(56) References Cited

U.S. PATENT DOCUMENTS

| | | | |
|---|---|---|---|
| 3,885,417 A | | 5/1975 | Stern |
| 4,168,506 A | * | 9/1979 | Corsover ............. 347/262 |
| 5,075,718 A | * | 12/1991 | Suzuki et al. ............. 355/50 |
| 6,352,025 B1 | | 3/2002 | Neiconi et al. |
| 7,828,547 B2 | * | 11/2010 | Gelbart ............. 432/8 |
| 2004/0184020 A1 | | 9/2004 | Trost |
| 2004/0218162 A1 | | 11/2004 | Whitney |

FOREIGN PATENT DOCUMENTS

| | | | | |
|---|---|---|---|---|
| GB | 2257820 A | * | 1/1993 | ............. G11B 15/60 |
| WO | 2006036019 A2 | | 4/2006 | |
| WO | 2006052919 A1 | | 5/2006 | |

OTHER PUBLICATIONS

WO_2013182562_ISR, dated Sep. 6, 2013, mailed Sep. 18, 2013, 3 pages.

* cited by examiner

*Primary Examiner* — Hai C Pham
(74) *Attorney, Agent, or Firm* — Haynes Beffel & Wolfeld LLP

(57) ABSTRACT

The technology disclosed relates to patterning of flexible substrate. One implementation can be applied for production of flexible displays and other electronic devices on flexible substrates. The substrate may be plastic film typically 50-150 microns thick and the size of the pattern features may typically be in the range 1-10 microns across. Larger and smaller structures are possible. The patterning is done by means of optical exposure, either by exposure of a photosensitive resist or lacquer, or by other thermal or photochemical interaction between the light and the substrate. The substrate may typically be loaded as a roll and after exposure and other processing it may be rolled up on a second output roll, so called roll-to-roll (R-to-R) processing.

24 Claims, 12 Drawing Sheets

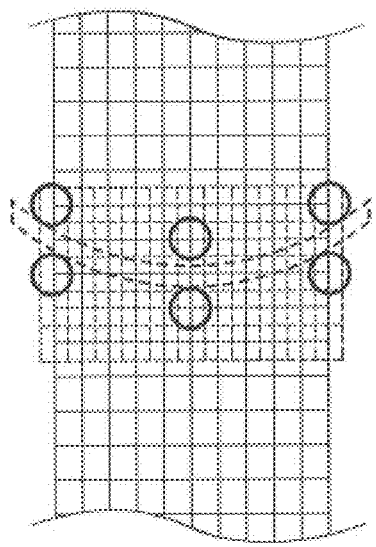
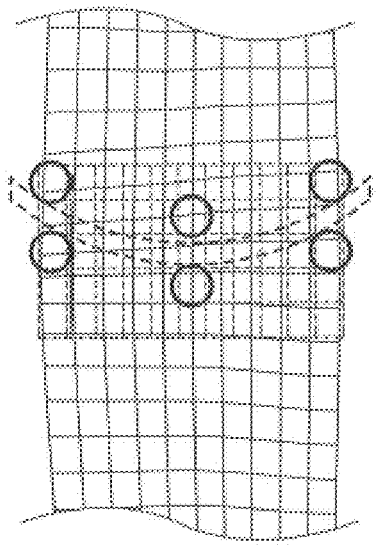
FIG. 3C  FIG. 3D
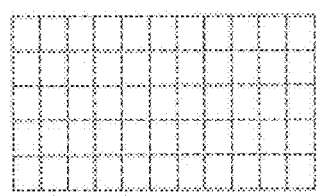
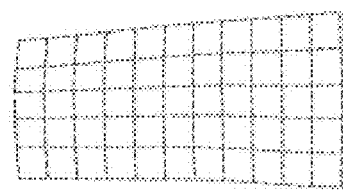
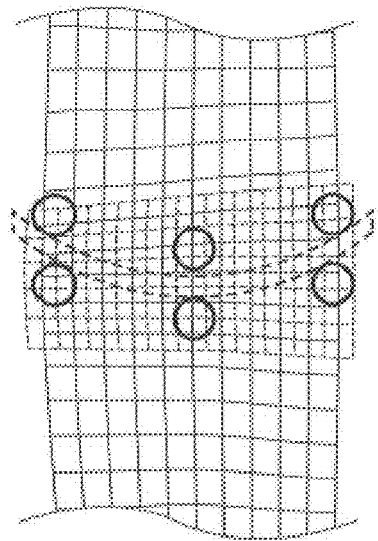
FIG. 3E

Mechanical engraving

Mechanical engraving

Deposition of particles, liquids or films on top of the surface, e.g. ink-jetting Laser marking of the surface or a film on the surface

OPTICAL WRITER FOR FLEXIBLE FOILS

RELATED APPLICATIONS

This application is related to and claims the benefit of U.S. Prov. App. Nos. 61/655,411 filed 4 Jun. 2012 and 61/777,144 filed 12 Mar. 2013, both entitled "Optical Writer for Flexible Foils" and naming Torbjörn Sandström as an inventor. These provisional applications are hereby incorporated by reference. A related PCT application is being contemporaneously filed.

TECHNICAL FIELD

The technology disclosed relates to patterning and other optical processing operations on flexible substrate such as inspection, metrology, and optical characterization. One implementation can be applied for production of flexible displays and other electronic devices on flexible substrates. The substrate may be plastic film typically 50-150 microns thick and the size of the pattern features may typically be in the range 1-10 microns across. Larger and smaller structures and/or structures formed on thicker or thinner substrates are possible. Patterning is done by means of optical exposure, either by exposure of a photosensitive resist or lacquer, or by other thermal or photochemical interaction between the light and the substrate. The substrate may typically be loaded as a roll and after exposure and other processing it may be rolled up on a second output roll, so called roll-to-roll (R-to-R) processing. Alternatively processing can be performed on cut pieces of flexible materials, e.g. sheets.

BACKGROUND

An example of background art is shown in FIG. 1, which shows a laser writer for printed circuit boards, implemented as Micronic Mydata's LDI 5s system. The technology is described in several patent applications filed by the same assignee.

The figure shows the main blocks of the writer, namely a stationary part 100 containing laser source and optics, a rotor 102 which relays the laser light 114, 116 to the workpiece 106 and scans the workpiece at a relatively high speed, and finally a stage 104 holding the workpiece 106 and moving the workpiece relative to the axis of the rotor 102. The stationary part 100 contains a light source 108 which can in the general case be a laser or another light source, e.g. a collection of LEDs or an arc lamp. The light source also has optics for conditioning the light to illuminate the modulator 110, which modulates the light to create a large number of modulated light beams. In LDI 5s, which has a linear SLM as modulator, the number of light beams is approximately 8000. With a different type of modulator the number can be higher, e.g. in the range 0.5 to 1.1 million (an XGA DMD from Texas Instruments or a 2D SLM from Micronic Mydata) or around two million (HDTV DMD from Texas Instruments) or around six million (SML from ASML-IMEC). Alternatively they can be fewer, e.g. around 2000 (GLV from Silicon Light Machines) or more numerous, e.g. approximately 8 million (4k×2k DMD for digital cinema from Texas Instruments). Other sizes exist or may be developed and multiple SLMs used simultaneously may be used. Alternatively, the light source and modulator may be implemented as an array of directly modulated laser diodes or LEDs, which creates a large number of modulated beams. The wavelength in the LDI 5s is 355 nm, but other wavelengths are possible from the IR, through the visible, and down into UV and Deep UV. The third block shown in the stationary part in FIG. 1 is a focus actuator 112, which based on measured focus data, refocuses the modulated beams on the workpiece. The light 114 is bent and transported by prisms, mirrors, and optical relays (not shown in the figure except the rotating pyramid mirror 128) first into the rotor 102, and then to the surface of the workpiece 106. The rotation of the rotor 102 traces the image around a circle 124. The beams illuminate an arced swath 120 on the workpiece. Since there are several arms with optics 118, 126 and the pyramid mirror 128 always directs the light to the arm, which is positioned at, or close to the workpiece a series of arcs 122 are exposed. The stage 104 is moving slowly as the arrow 105 shows and the multiple arcs form a contiguous exposed area 123 on the workpiece 106. The exposed area is patterned by the modulated beams and a data channel (not shown) turns the beams on and off in accordance with the input data describing the pattern to be written.

BRIEF DESCRIPTION OF DRAWINGS

FIGS. 3C-3E conceptually illustrate use of a warped coordinate system.

SUMMARY

The technology disclosed relates to patterning and other optical processing operations on flexible substrate such as inspection, metrology, and optical characterization. One implementation can be applied for production of flexible displays and other electronic devices on flexible substrates. The substrate may be plastic film typically 50-150 microns thick and the size of the pattern features may typically be in the range 1-10 microns across. Larger and smaller structures are possible. Patterning is done by means of optical exposure, either by exposure of a photosensitive resist or lacquer, or by other thermal or photochemical interaction between the light and the substrate. The substrate may typically be loaded as a roll and after exposure and other processing it may be rolled up on a second output roll, so called roll-to-roll (R-to-R) processing. Alternatively processing can be performed on cut pieces of flexible materials, e.g. sheets.

DETAILED DISCLOSURE

First Technical Problem

A U.S. patent application Ser. No. 12/718,895 by the same assignee as this application, which relies on U.S. provisional application 61/158,310 by Lars Stiblert et al., discloses writing with a spinning rotor that does a fast mechanical scanning of the workpiece with little inertia, vibration or overhead, as compared to a reciprocating stage or writing with the same scanning speed. The application and provisional application are hereby incorporated by reference. A rotor system has been designed and built by Micronic Mydata, the LDI 5s, with a rotor that is approximately 800 mm in diameter and spins about one revolution per second. The useful writing width is over 500 mm.

Figure 4:
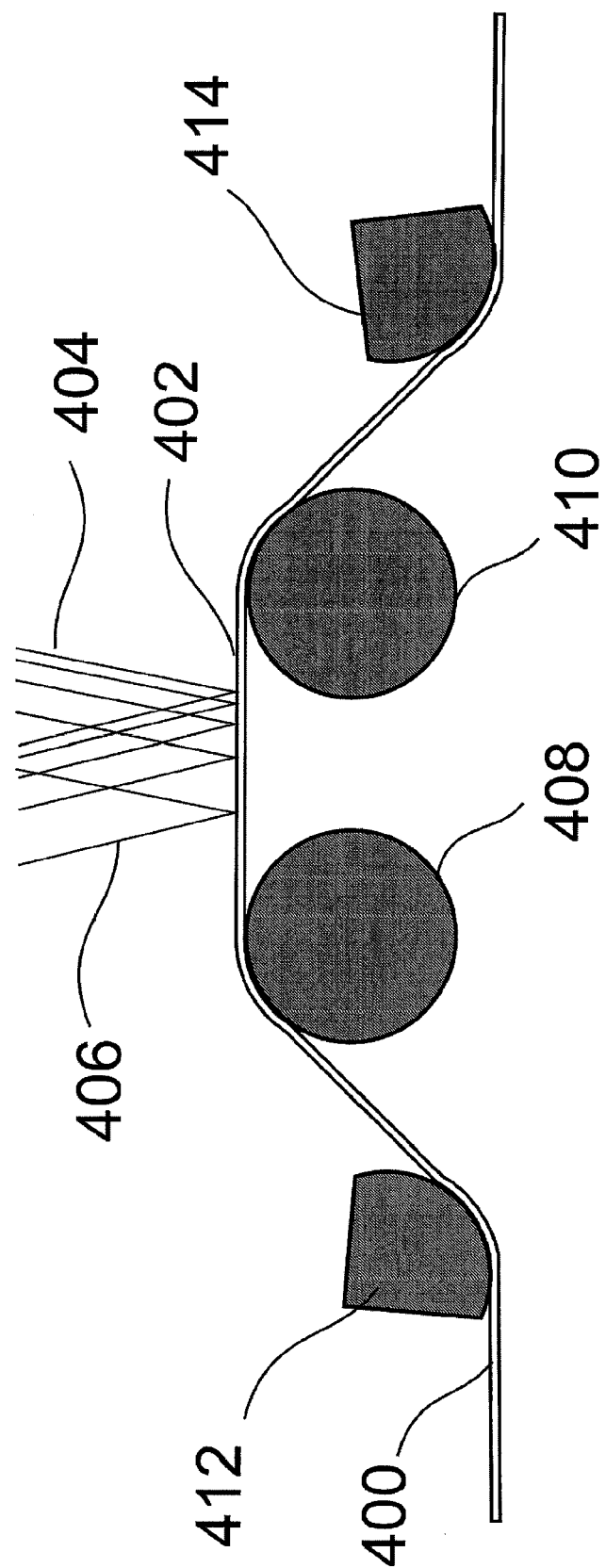
FIG. 4 gives a side view of a flexible foil and movement guides.

Instead of exposing printed circuit boards under the rotor, a system can be built to expose a continuous or sheet-form flexible foil. Typically roll-to-roll material is plastic, but it can also be thin flexible glass soon to be commercially available from Corning and Asahi Glass. In this disclosure, a variety of roll-to-roll materials are collectively referred to as flexible foil. These materials include what is called a web in other discussions of roll-to-roll development. It can also be paper or a metal foil. In either case the surface of the material is sensitive to mechanical contact, in many cases also the backside. The rotor, writing on an arc, can be designed to hold comparatively large surface to be flat and in focus. Even though the field width at any point along the writing arc may be small, e.g. 14 mm in LDI 5s, the bent arc spans about 100 mm along what would be the direction of movement of the flexible foil. In FIG. 4, a flexible substrate 400 is shown from the side. The light beam writing at the center of the arc is to the left 404 and the light beams writing the ends of the arc to the right 406. If the flexible foil is stretched flat over rollers 408, 410 the flat area should be 100 mm plus a margin, by the length of the rollers. This raises a number of issues.

First, the foil may not be perfectly flexible in itself. A stainless steel foil has certain stiffness and it may have a built-in bend. To stretch such a stiff foil to a flat surface within the depth of focus of the optics would require a very taut tension. Furthermore, when the foil already has some patterned films on it may have waviness from the built-in stress in the films, which is even more difficult to remove by stretching.

Second, pulling the foil flat as described above requires large forces, which cannot be applied without mechanical clamping. But clamping threatens to cause damage to the film and compromises the notion of a continuous smooth movement. If the forces are applied only at the edges it is possible that the foil will deform, elastically and inelastically, which makes it more difficult to achieve good overlay between different layers in multilayer structures. The higher the forces the more deformation, in particular with plastic substrates.

Third, a taut flexible foil say 180×500 mm is a big drum skin which will react and flex for all air movement around the foil. The foil is in close proximity to the spinning arm, which has a high peripheral velocity, e.g. 2-3 m/s. Even if the rotor has smooth surfaces, it may create turbulence in the air and disturb the substrate.

Fourth, most thin substrates deform during processing due to handling, temperature cycling and stress in the deposited films. If sensitive multilayer patterns are formed, such as thin film transistors, it is useful to be able to adjust and correct the overlay of the layers based on measured distortions. This can be done continuously, while the flexible foil is fed through the system.

Technical Solutions

Figure 1:
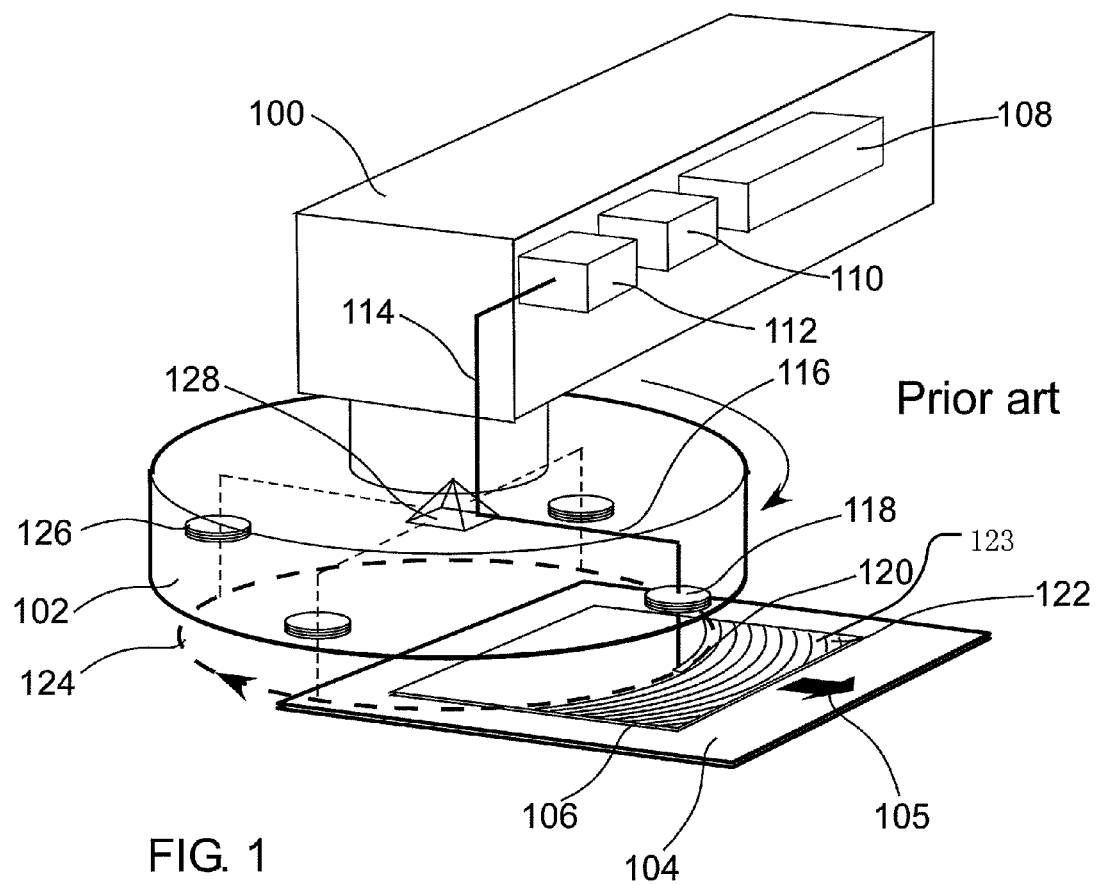
FIG. 1 shows a laser writer for printed circuit boards, implemented as Micronic Mydata's LDI 5s system.
Figure 2:
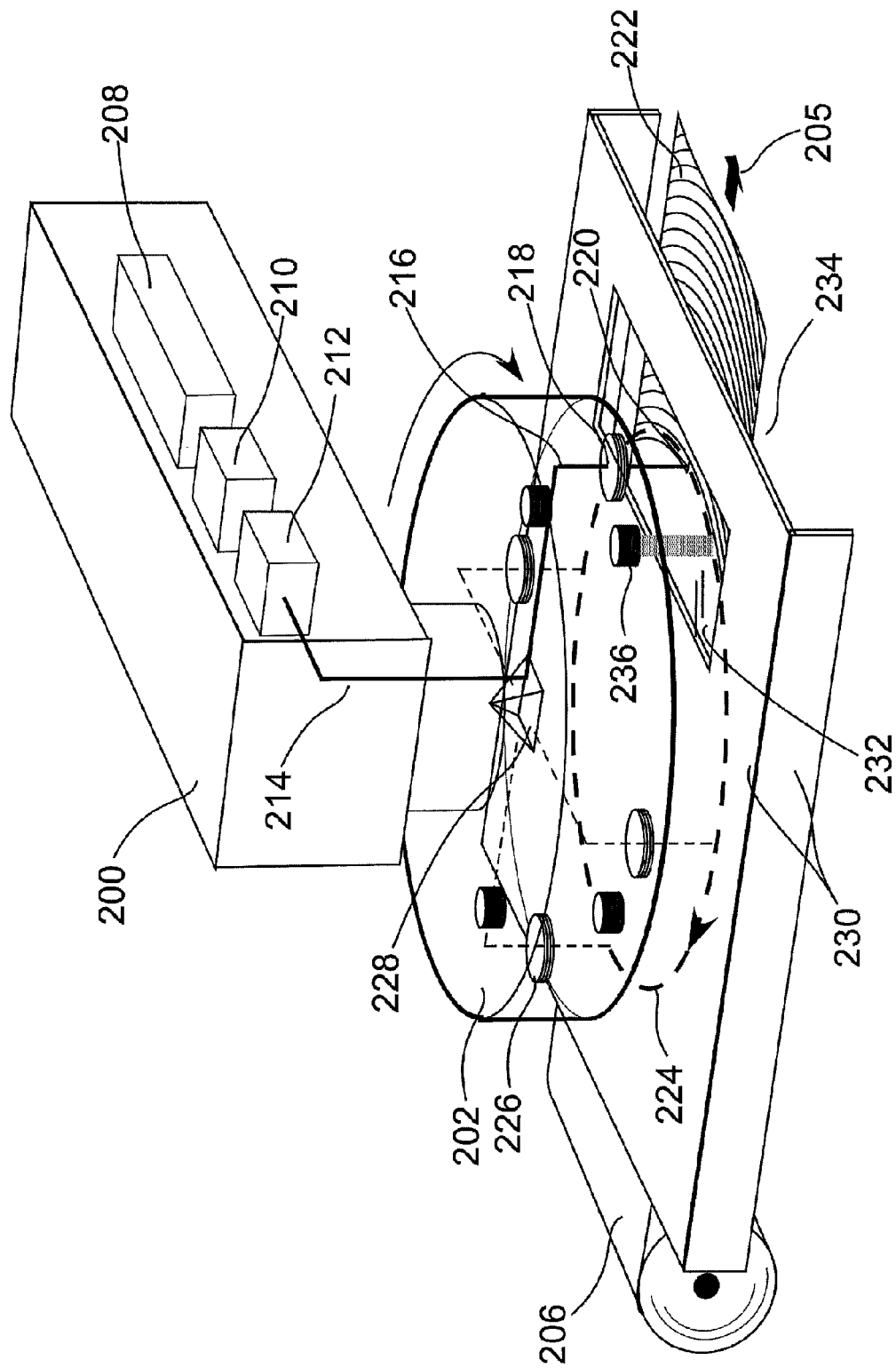
FIG. 2 shows a rotor and flexible foil can be placed in different, aerodynamically or fluidly isolated compartments in close proximity.

One aspect of the technology disclosed is that the rotor and the flexible foil can be placed in different, aerodynamically or fluidly isolated compartments in close proximity. An example is shown in FIG. 2, which has most of the elements from FIG. 1: a stationary part 200 and rotor 202, a light source 208, a modulator 210 (208 and 210 can be combined) and a focus actuator 212. The light path 214 in the stationary part 200 and in the rotor 202, the arced swath 220 and the written area 222, several arms (2, 3, 4 or more) with optics 218, 226 tracing a circle 224 and the pyramid mirror 228. In contrast to FIG. 1, this figure does not have a stage with a workpiece sheet. Instead, a flexible foil 206 is continuously fed 205 through the system while it is being patterned. The flexible foil 206 can be placed in a quiet compartment 234 where it is protected from at least turbulence from the rotor 202. It also may be protected from noise associated with the rotor 202. The exposing beam goes through a window 232 which may be inserted in a wall or aerodynamic barrier 230.

A second aspect of the technology disclosed is that the atmosphere can be different in the compartment 234 than in the ambient, e.g. for laser-assisted chemical processing or patterning. The space adjacent to the flexible foil may be filled with vacuum, an inert gas, a reactive gas or a liquid, while the rotor is operating in air or in a purging gas, e.g., nitrogen.

A third aspect of the technology disclosed is that a fast focus system is used to follow the non-flatness or vibrations of the stretched web. The focus actuator may be a micromechanical system such as an adaptive mirror, such as one commercially available from OKO, ALPAO, Boston Micromechanics, or one following the design disclosed a pending patent application by Luberek from Micronic Mydata, WO 2012/116995 A1 entitled ADAPTIVE OPTICS DEVICE AND METHOD, which claims priority to U.S. provisional application 61/447,699, both of which are hereby incorporated by reference. Such focus actuators can be designed with a bandwidth (responsiveness) above 100 Hz or even above 1 kHz. Focus sensors are preferably placed on the rotor, measuring the flexible foil height a short time before the area is exposed. FIG. 2 shows each arm to have a preceding focus sensor 236 measuring a point on the flexible foil less than 100 ms before it is written. The focus correction is computed and applied to the focus actuator as a feed forward correction.

Figure 3A:
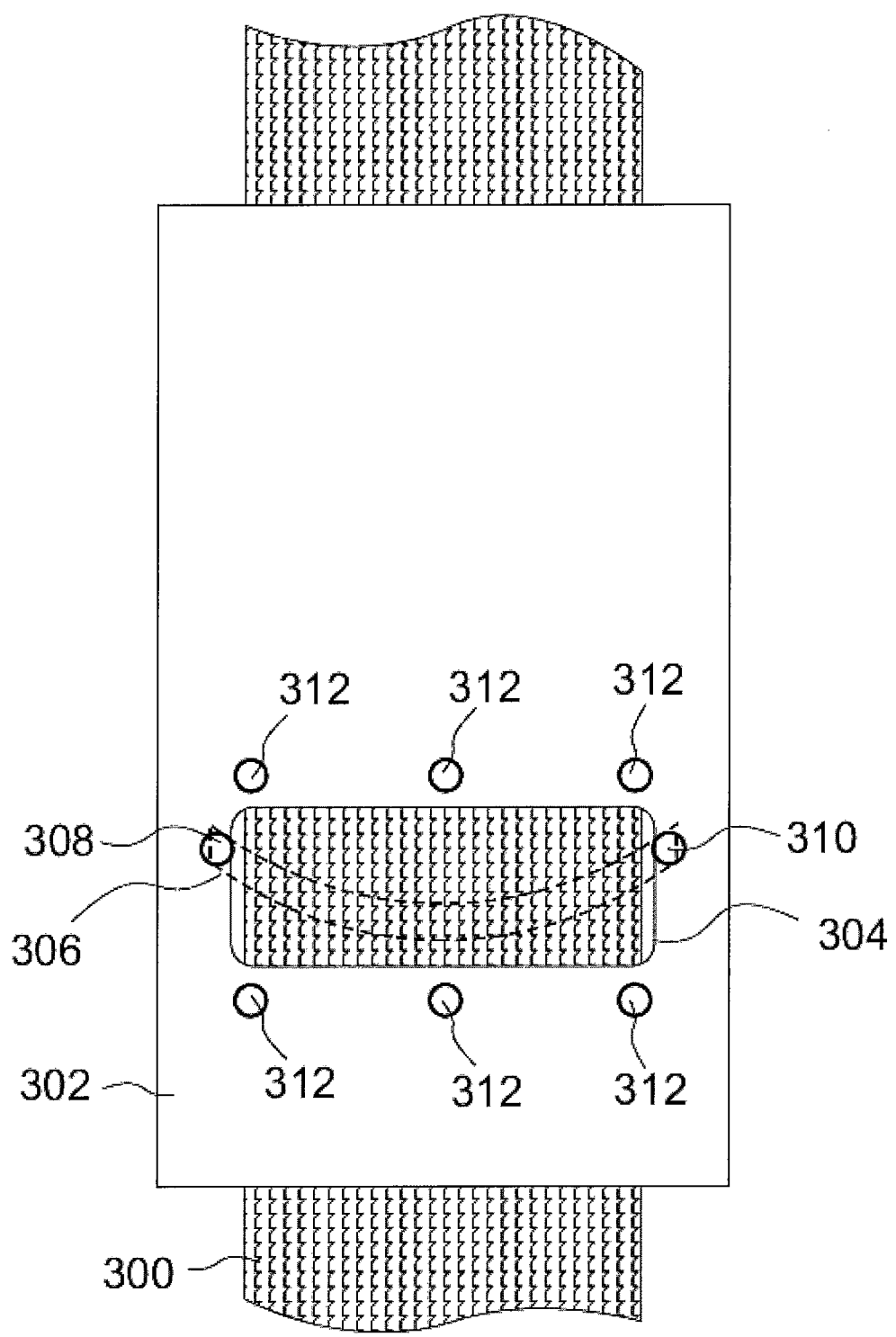
FIGS. 3A-3B illustrate one implementation of sensors used to dynamically measure distortion of a flexible foil.
Figure 3B:
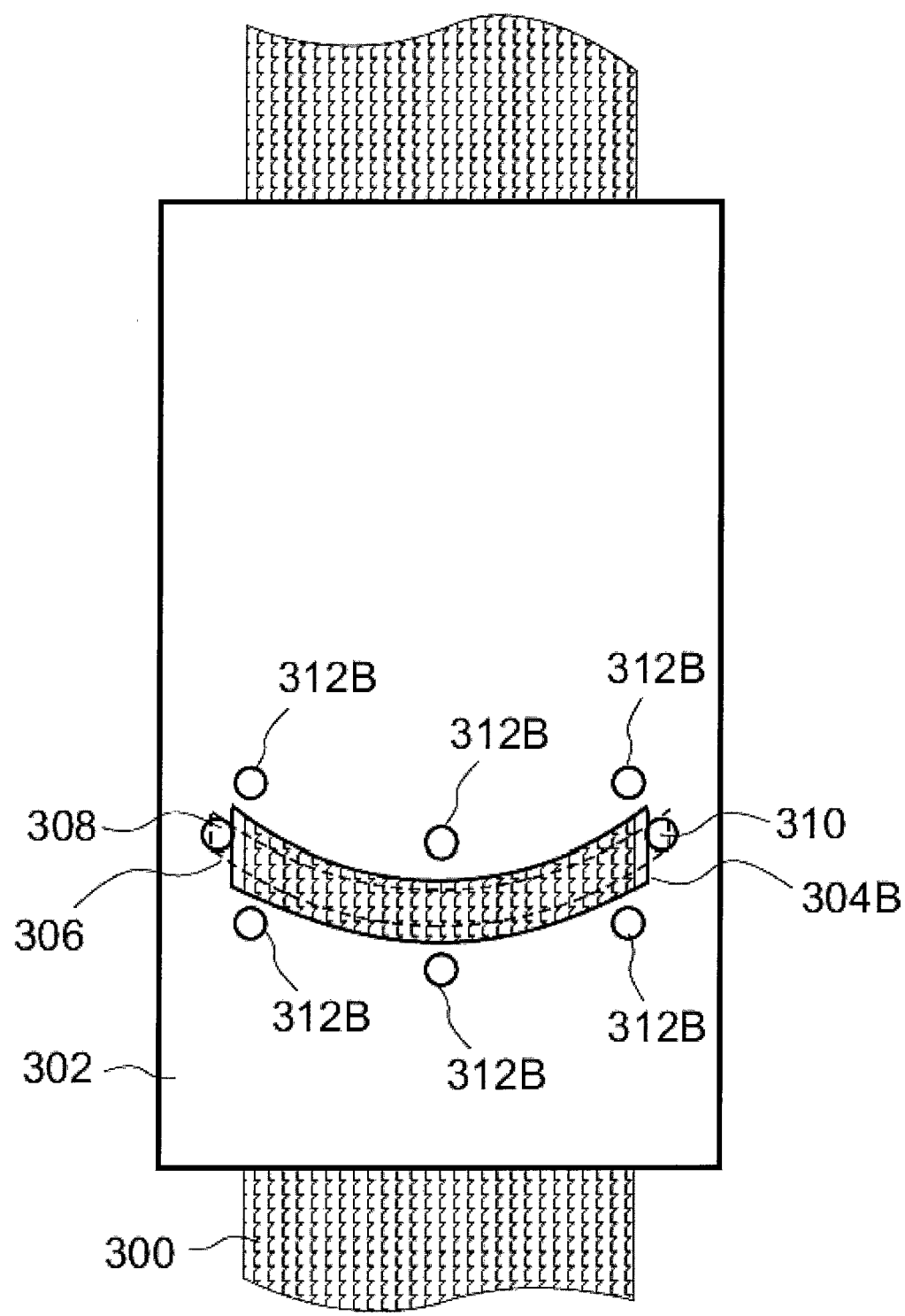

A fourth aspect of the technology disclosed is that distortion of the flexible foil (300 in FIGS. 3A-3B) can be measured dynamically (i.e., while it is moving) by several sensors 312. There may be sensors before and after the writing arc 306 near each edge and at least one sensor between the edges. FIG. 3A shows the sensors 312 outside the window 304 in the barrier 302. One or more additional sensors 308 and 310 may sense the travel of the writing beam to precisely locate its position independently of reports of the writing mechanism's movement. In an alternative implementation, FIG. 3B shows several sensors 312B outside a narrowed window 304B in the barrier 302. The narrowed window 304B exhibits an arced shape that follows the shape of the arced swath 220 more closely than the window 304, which has a rectangular shape. The narrowed window allows writing of the flexible foil 206, and allows the preceding focus sensor 236 to measure a point on the flexible foil before it is written. Another implementation would place the sensors inside the window area. A third example embodiment of this aspect would be to have no barrier at all, but place the sensors in a similar pattern. The displacements of the flexible foil at the sensor positions are used to compute a warped coordinate system around the writing arc 306 and to correct the writing position accordingly. FIGS. 3C-3E conceptually illustrate use of a warped coordinate system. This computing can be done as described in the patent applications naming inventors Österberg and/or Sandström from the same assignee. For instance, application Ser. No. 12/631,595 by Österberg and Ivensen describes an architecture that is useful in translating between coordinate systems.

A fifth aspect of the technology disclosed, but not disclosed in the figures, is that non-ideal behavior in the scanning and imaging hardware can be measured by scan sensors 310 scanned over by the rotor and mechanically referenced to the sensors for the flexible foil 312. In this way the sensors detect drift in the relative positions of the image and the flexible foil, regardless of the cause of the drift, and the drift is automatically corrected for. During calibration of the platform, the physical relationship between the scan sensors 310 and flexible foil position sensors 312 is ascertained. During writing, drift in the relative position of the scan head that is tracked by the scan sensors 310 and the flexible foil position that is sensed by the flexible foil sensors 312 can be immediately detected and taken into account.

Figure 5A:
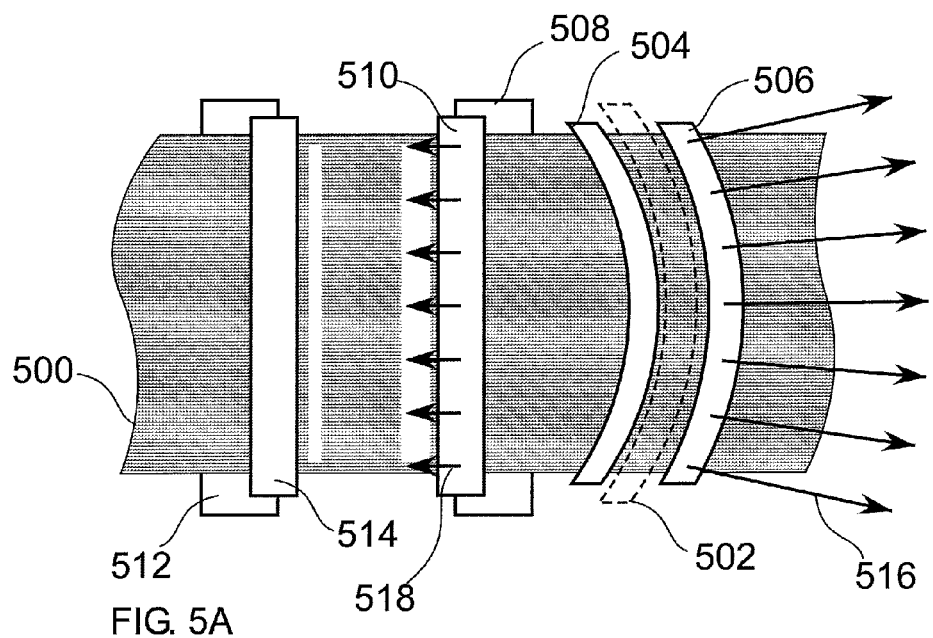
FIGS. 5A-5B are conceptual top and side views of a flexible foil fed through a transport path with a writing area.
Figure 5B:
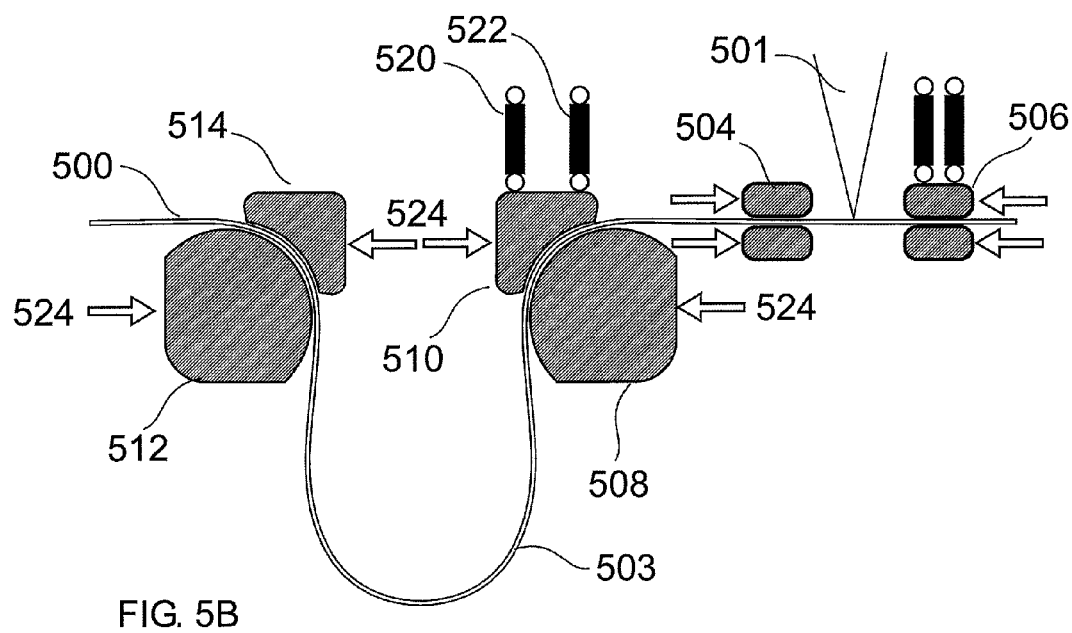

A sixth aspect of the technology disclosed is that the flexible foil can be flattened and stretched between air bearing pads/rulers/flat plates as depicted in FIGS. 4 and 5A-5B. In FIG. 4, non-rotating convex bearings 408, 410, 412, 414 guide the flexible foil 400 and allow it to be stretched flat across a field of exposure 402. At various positions along the writing arc, exposing radiation impinges closer to roller 408 or 410. Another implementation of air bearings is depicted in FIGS. 5A-5B, which present a top and side view. In these figures, air bearings 504, 506 are shaped to follow the edges of writing arc 502. The flexible foil enters the writing space flat over bearings 508, 510 and is stretched across the space between the pairs of bearings 504 and 506. The space between the bearings can be as narrow as a writing beam 501 can use or it can be wider. The distance between the pairs of air bearings in the direction of feeding the flexible foil can be one-fifth less (at least five times smaller) than the length of the optically writing/reading/measurement/characterization area in the cross-wise direction. For a straight optical processing area as in FIGS. 7B, C or for curved air bearings as in FIG. 5A the same distance can be one-tenth or less (at least ten times smaller than) the length. The pairs of bearings 504 and 506 may have different arcs or one of them may not have any arc, depending on the forces desired to create tension 516 in the flexible foil and generally along the direction of movement of the flexible foil. There may not need to be any physical contact between surfaces of the air bearing and the flexible foil. Flattening of a flexible foil requires only moderate tension, with differential forces on bearing 510 applied by actuators 520, 522 retarding 524 the advance of the foil 503 and differential forces actuating bearing 506 urging the foil on. The rulers may have opposing rulers or they may operate against a flat common surface. Typically the rulers are made as porous air bearing pads, e.g. from the company NewWay of Aston, Pa., USA. Also illustrated in FIGS. 5A-5B is a feed loop between rollers 512, 514 and 508, 510. This loop can be used to isolate the feed rate at 500 from the feed rate at 503 and absorb variations in the feed rate at 500. This lowers the inertia of the film being fed through writing system, thereby making fast control of the movement easier. It is also important since certain steps in a roll-to-roll processing plant may use a stepped motion, i.e. the foil stops while a certain area of it is imprinted, baked, cleaned, etc. The loops allow easy interfacing between processes with stepped and continuous processing. The writing system described in relation to FIGS. 1 and 7 typically use continuous movement of the foil and the technology disclosed in this application allows a continuously moving processing system, while prior art typically step the foil forward and processes a rectangular area at a time. A continuous movement is faster because of less overhead and it is more flexible since there are no forbidden areas between the rectangles processed in prior art.

Flattening of a substrate by an air bearing has been described in prior art: US2006/0219605A1 by Andrew Devitt describes a one-sided air bearing which has areas with both pressure and vacuum to create an energy minimum when a sheet of glass is held a certain distance (a few tens of microns) from the surface of the bearing. A glass that is bent will be flattened since the spring constant of the air cushion is much higher than the bending spring constant of a large thin glass sheet. In US2007/0195653 by Yuval Yassour a workpiece is inserted between two one-sided bearings (FIG. 14A), the second one serving "for loading/unloading and for safety reasons." Finally U.S. Pat. No. 7,530,778 by Yuval Yassour describes many different air bearing configurations for holding and flattening a thin substrate. Yassour talks about three types of air bearings: PV which are principally one-sided with an array of orifices supplying pressurized air and another array, interleaved with the first array, of holes connected to vacuum. Properly designed PV bearings have an energy minimum when the substrate is held close to the surface, but not in contact with it. PA bearing have an array of orifices connected to pressure and holes, slits or areas connected to the ambient. The third type PP have the substrate squeezed between two bearing surfaces with orifices connected to pressure and a mechanical preload that squeezes the air gap to a small value. The latter bearing type has much higher force and stiffness than any of the other two. U.S. Pat. No. 7,530,778 also shows two sections of PP bearings adjacent to an area of the substrate where some processing is performed. It is noted that the distance between the bearing edge and where flatness is needed has to be a minimum distance, the relaxation distance. The reason is that the bearing has an array of orifices or slits for pressure and/or vacuum or evacuation and this error causes an undulation in a thin substrate.

Applying the structure with two of the PP bearings described in U.S. Pat. No. 7,530,778 to thin flexible foils with multi-layer components on gives rise to some technical problems: a thin foil is much less stiff than the glass sheets in the patents above. Especially after one or more films have been deposited and patterns are formed in the films the foil may have a strong tendency to curl and the curling may be different from place to place. The bearings with alternating areas or orifices for pressure and ambient/vacuum depend on the stiffness of the glass sheet to find an average flying height over the bearing surface. A thin plastic foil may lift over pressure areas and be sucked aground where there is vacuum or evacuation to the ambient. Furthermore, local curling may cause points on the foils to touch the bearing surface, scratching the films and causing contamination.

The technology disclosed uses a combination of changes from prior art to ensure flatness and safe operation: first, the bearings are porous air bearings where every point of the bearing surface bleeds an air flow, thereby effectively repelling any solid surface. Secondly, because the porous bearing has a uniform action over the area of the bearing it needs no "relaxation distance" to smoothen the undulations from the array of orifices or evacuation areas, allowing the bearing surface to be positioned closer to where the foil need to be flat. The foil is pressed flat with high force between the upper and lower bearing surface in each pair of air bearing. Long-range curvature is held flat close to the bearing and short-range curling may be inelastically flattened when passing through the proceeding pair of bearings. The air bearings are close to the optical processing area and surrounding it before and after. Bulging between the two pairs of air bearing is further reduced by stretching of the foil. Thus the flexible foil is flattened by the combined effect of the high-force squeezing between two porous bearing surfaces, the proximity to the bearings, the homogeneity of the porous bearing surfaces and the stretching of the foil. A secondary benefit of using porous gas bearings is that a foil can be fed into a porous bearing without much force if the bearing has a slight taper at the edge.

Figure 6:
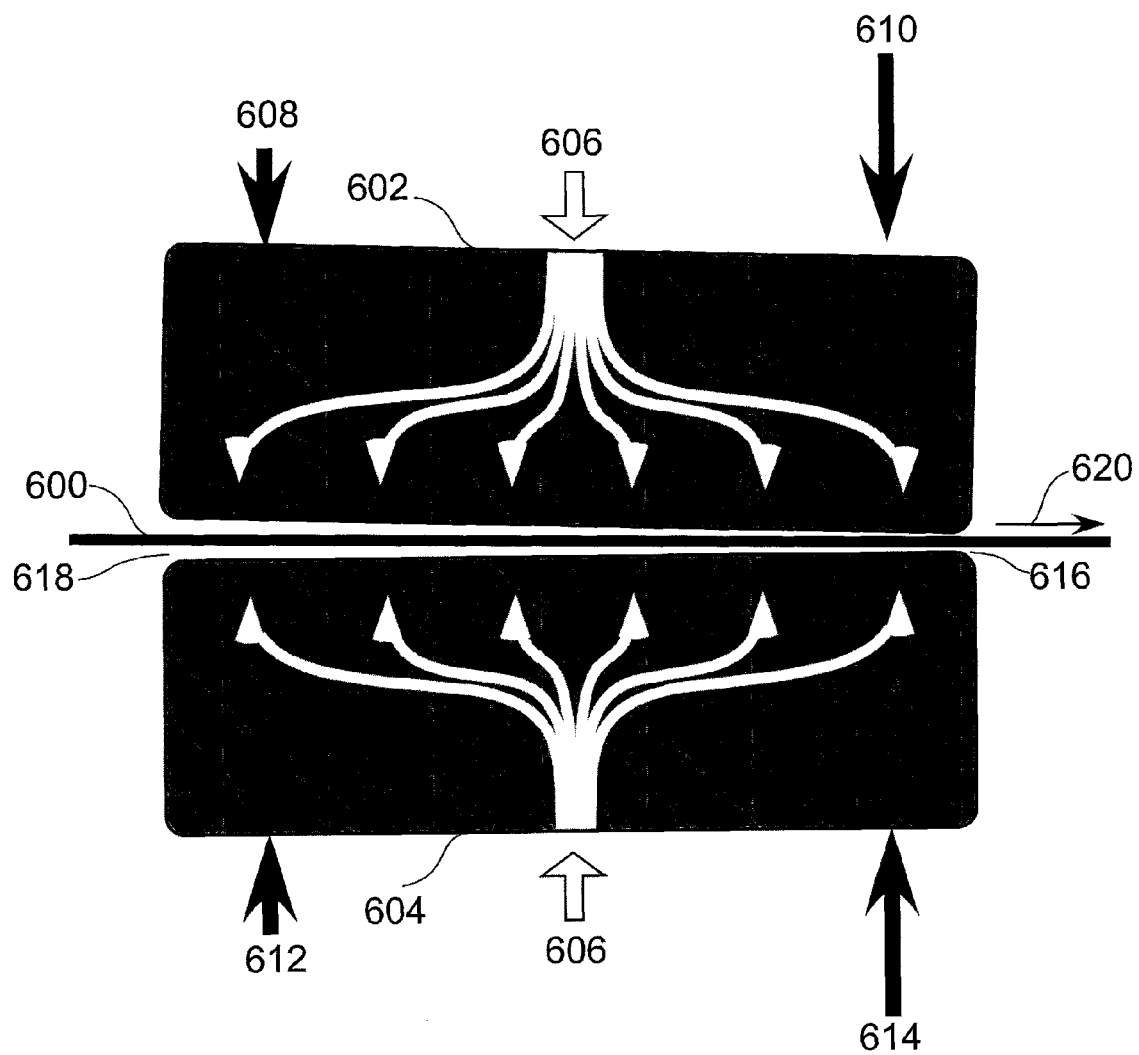
FIG. 6 illustrates two porous pads positioned close together with a foil between them.

A seventh aspect of the technology disclosed is that feeding, steering, spreading and/or stretching of the flexible foil can be done in a non-contact fashion by the air bearings. NewWay presented a proof-of-concept air bearing drive for a flexible foil at the conference 2012FLEX in Phoenix in February 2012. It was based on radial porous bearings used as non-rotating rollers. An endless stainless steel foil was running contact-free over three bearings. When an external concave radial bearing was pushed against the radial bearing with the foil in between and the external bearing was asymmetrically loaded, the foil started running, forward, backward or to the sides. FIG. 6 shows a flat equivalent. Two porous pads 602, 604 are pushed together and a foil 600 is placed between them. When air 606 is pressed into the pads an air film is created on both sides of the foil and the foil can be moved freely. In the figure, the gap space between the air bearing pads is asymmetrical, with 618 having a wider gap than 616. The force on one side will be smaller than the force on the other side. Applying less normal force at one side than the other will induce a force along the flexible foil's direction of travel. It is believed that the air bearings are canted in the manner shown in the figure, the force at 608 will be smaller than the force at 610. It is reasoned that the reaction forces 612 and 614 adapt to match and the air gap is smaller on the high-force side 616 than on the low-force side 618. The air on the left side will be mostly escaping to the left and the air on the right side to right, but the pressure and velocity gradients are higher where the gap is narrow 616. The viscosity of the air will pull it more strongly to the right 620 than to the left and the foil will start to move to the right. It has been observed that a non-uniform gap will cause material to move between a pair of bearings. It may be that the physical description above mistaken and that the foil will move in the opposite direction indicated by arrow 620. Still, it is well understood and appreciated that the air bearings can move the material along. This can be used to manipulate the flexible foil without physical contact. The surfaces facing the flexible foil may be flat or having an extremely shallow bend (order of 10 microns) to optimize the force. The effect can be used to control the feeding of the foil through the optical processing area 502, which is also called the writing slit area. The movement and/or position of the foil is measured and compared to the desired movement and/or position. The squeezing forces on at least one pair of air bearings is modified, e.g. by piezo actuators 520, 522 to make the forces 608, 610 more or less asymmetrical. Changing the asymmetrical loading of the air gap affects the generated aerodynamic forces acting on the foil and the feeding can be speeded or slowed down. The system can be configured as a feedback system with a controller keeping the movement of the foil as desired. The forces on the foil are relatively small but the mass of the controlled area of the foil is also small so a useful control bandwidth is achievable. The loop 503 is important to keep the mass of the controlled section of the foil small, by allowing movements of the foil after the loop without being loaded by the inertia of the foil before the loop. A second loop can be used in a similar fashion to isolate the controlled area from inertia and disturbances of foil after the second pair of air bearings 506.

FIGS. 5A and 5B show how the air bearing forces can be used to spread the foil 500 and stretch it in the crosswise direction. Divergent forces 516 result when the ruler 506 is curved and asymmetrically loaded. The trailing ruler 504 is shown passive but may also be used for controlling the flexible foil. The force holding the flexible foil back is shown to come from the linear air bearing 510, 508, which also can be used to turn the foil into a slack variable feed loop 503. The air bearing 512, 514 holds the other side of the slack. The two bearing used to create in-plane forces 510 and 506 are shown with piezo actuators 520, 522 (can be any type of actuator: magnetic, screws, thermal, etc.), which can apply an asymmetrical loading. All air-bearing pads are shown as porous pads with air 524 blown into them. The force generated is small, typically below 10 N, but with the force acting directly on the foil the masses are also very small and the entire system is contact- and friction-free. The out-of-plane movements of the pads needed to modulate the in-plane forces are only a few microns and the stiffness of the pad and the actuators can be high, giving fast adjustments of the in-plane force. Therefore it is anticipated that the control of the movement of the flexible foil will be nimble and fast.

Figure 7A:
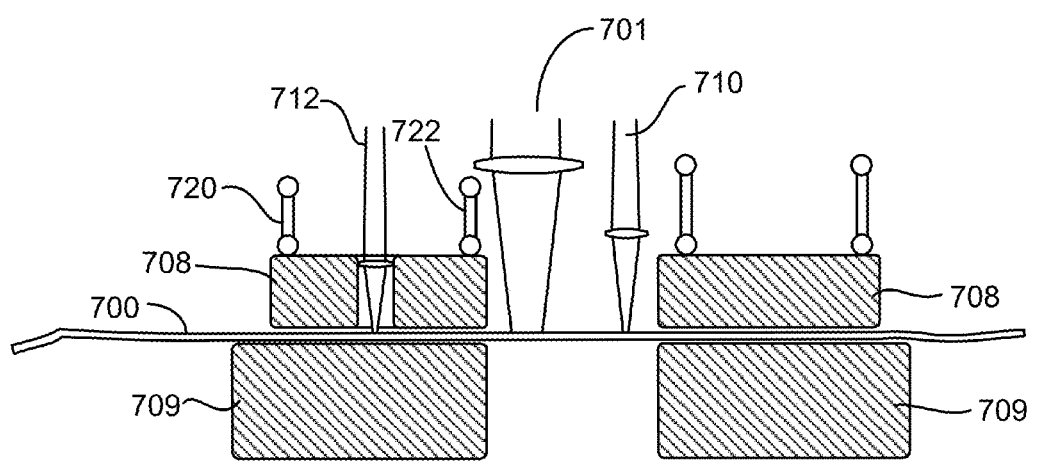
FIG. 7A is a cross section view of a flexible foil fed between sets of porous pads with a writing area between them.
Figure 7B:
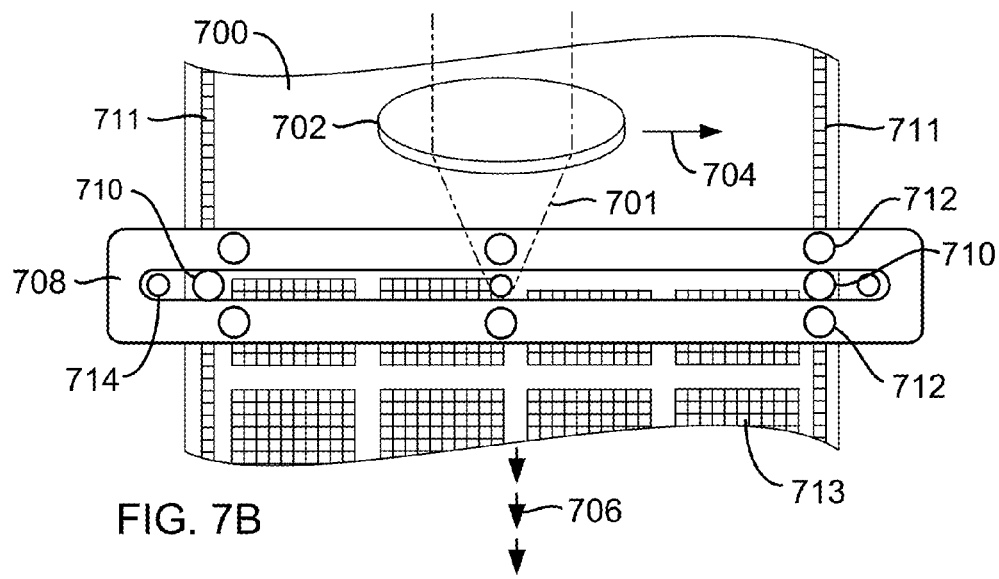
FIGS. 7B-7C conceptually illustrate top plan and orthogonal views of a writing head used with a flexible foil.
Figure 7C:
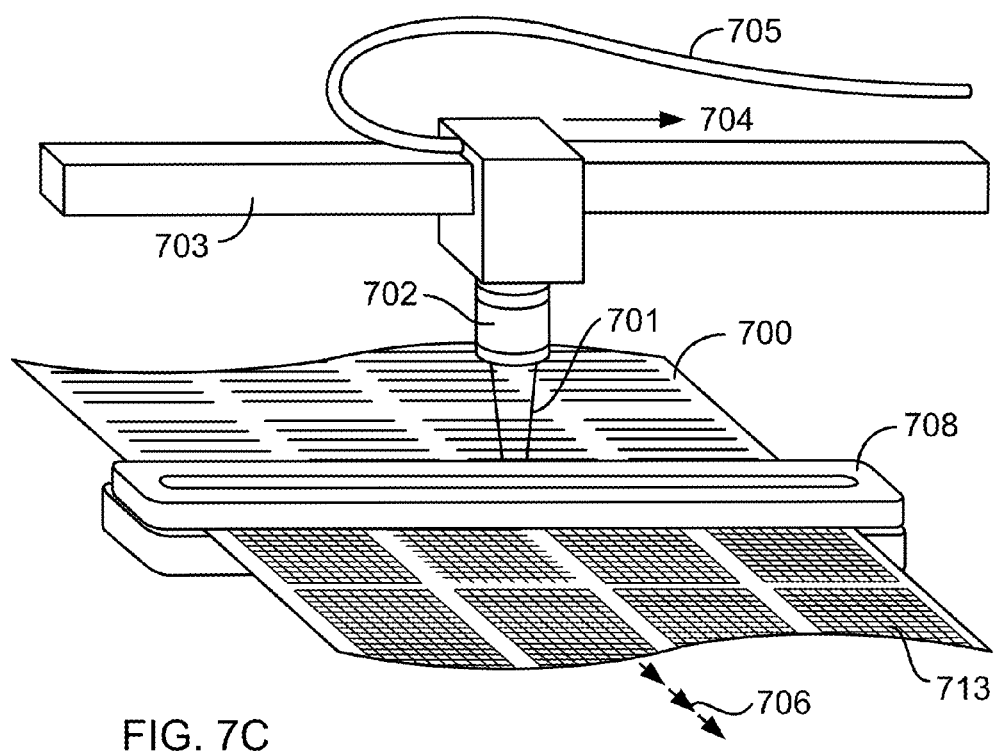

FIGS. 7A-C show alternative implementations. FIG. 7A is a cross section of FIG. 7C, showing various locations for sensors 312 previously identified. In FIG. 7A, the air bearings are 708 and 709. Actuators such as 720, 722 precisely control the position of at least one air bearing in a pair. The flexible foil 700 is positioned between the air bearings. Sensors can alternatively be positioned in the same window 710 as the writing/inspecting/measuring/characterizing optics 701 or in a location away from the writing window 712.

FIG. 7B shows sensors 710, 712 at the edge of flexible foil, reading a pattern 711 along edges of the foil. This allows for detection and correction of distortions in the flexible foil. The foil advances in direction 706. Sensors 714 detect the position of the writing beam 701, shown as being projected through one or more lenses 702 onto the flexible foil 700. The writing beam is shown as moving along a straight path from left to right 704. The writing beam also can move along a curved path and apply the same edge sensor configuration as depicted.

FIG. 7C is an orthogonal view of the same implementation shown in FIG. 7B. The same reference numbers are applied to both FIGS. 7A and 7B, for ease of understanding. In addition, an arm 703 for carrying at least the lens system 702 is shown. In this implementation, the writing head moves along path 704. A flexible cable 705 feeds data to the writing head. Many other writing system configurations can be imagined that would benefit from the feed, bearing, and alignment mechanisms disclosed.

Additional Technical Problems and Solutions

One technical problem to which the technology disclosed can be applied is direct patterning at high speed of a moving flexible foil. The technology is applied using a spinning disk like in the Micronic LDI to write on the foil held in a flat state, e.g. going from roll to roll and being stretched into a flat state, and being fed continuously. Applying this technology, the effective speed of the writing head relative to the foil is high and the stage overhead is low, giving efficient use of the modulator and optics.

Another technical problem to which the technology disclosed can be applied is exposing a suspended foil under a fast scanning writing head to up air movements caused by the movement of the writing head. The air movements disturb the writing process. Applying the technology disclosed can include aerodynamically isolating an environment containing the foil from another environment containing the mechanical moving writing head, using a solid wall, in combination with optically coupling the a writing surface of the foil to the writing head by a transparent member, e.g. using a window as the solid wall. Applying this technology, the foil can be written by a fast scanning writing head without being disturbed mechanically during exposure.

Another technical problem to which the technology disclosed can be applied is flattening a foil to be within the depth of focus of the writing head. This problem is addressed, without making hard contact to the foil's surfaces, by arranging air bearings, e.g. pairs of porous air bearing pads, close to the writing swath of the writing head creating a short suspended section of the foil between the air bearing pads. The suspended section can be less than 1.5, 2, 3, 5, or 10 times the width of the writing swath of the writing head. Optionally, the suspended section of the foil has one or more of a high bending resonance frequency, a small area catching the aerodynamic forces, and a short distance being bent by built-in bending forces, thereby being less sensitive to disturbances and built-in bending.

Another problem addressed using the technology disclosed is holding and flattening a suspended foil over an area where it is exposed by an optical system, having a writing swath, e.g. a curved writing swath. This issue can be addressed, without touching the surfaces of the foil, by clamping the foil at both sides of the writing swath with air bearing pads (or, generally, gas bearings pads), e.g. essentially flat pads, e.g. curved pads or e.g. flat curved pads. The distance between the pairs of pads can be less than 1.5, 2, 3, 5, or 10 times the width of the writing swath. Any built-in curvature can be flattened between the pads and the suspended section of the foil has a small area and reduced sensitivity to aerodynamic disturbances and built-in curvature.

Another problem addressed using the technology disclosed is spreading and tensioning a flexible foil. This issue can be addressed, without touching the surfaces of the foil, by arranging pairs of air bearing pads, e.g. porous pads, or essentially flat porous pads, or essentially flat curved pads, with the foil squeezed between air flows from the pads in one or more pairs, and manipulating the distribution of forces squeezing the pads together and/or a gap between pads in the airs to create drag (a resistive force) and/or advancing force (and advancing force) in the plane for the foil. The foil can be transported, tensioned and spread by the resistive and advancing forces.

Another problem addressed using the technology disclosed is controlling the motion of a foil. This issue can be addressed, without touching the surfaces of the foil, by arranging detectors, e.g. cameras, which measure the position of the foil, combined with comparing the measured position to a desired position. It involves computing distributions of squeezing forces on pairs of air bearing pads to move the foil to the desired position and controlling the squeezing forces at least in part using the computed distributions. The foil can be controlled in a fast and nimble way without mechanical contact.

Another problem addressed using the technology disclosed is writing a second pattern on a flexible deformable foil with good overlay to a previous pattern that has been deformed. The technology can be employed in a writer having a scanning writing head writing in a swath area much longer than its width, by arranging detectors, e.g. cameras, in or close to the swath area, detecting the position of the previous pattern, computing the deformed coordinate system of the previous layer over the swath area, modifying the second pattern according to the deformed coordinate system and writing said second pattern in the swath area. In this use, the second pattern can be aligned in real time to the previous pattern even during a continuous motion of the foil and a foil, which deforms during the continuous motion.

Another problem addressed using the technology disclosed is aligning a second pattern on a foil, whether or not the foil is deformed. This method involves a writer scanning a swath much longer than it is wide and having detectors for alignment to a previous pattern. It further involves having at least two auxiliary detectors near the ends of the swaths and detecting the position of the written swath, said detectors being mechanically referenced to the detectors for alignment to the previous pattern. The written pattern can be aligned to the auxiliary detectors and referenced to the previous pattern.

Particular Implementations

The technology disclosed can be practiced as a method, a system, or computer program instructions stored on computer readable memory that, when executed on a processor, cause a system to vary clearances between air bearings practicing any of the methods described herein. The technology disclosed also can be practiced as computer program instructions stored on computer readable memory that, when loaded onto a suitable system, complete any system as described herein.

One implementation describes a method of holding a flexible foil with improved flatness while being fed in a direction of feeding. This method includes passing a first segment of the flexible foil between a first pair of lower and upper porous air bearings and passing a second segment of the flexible foil between a second pair of lower and upper porous air bearings. The method further includes applying force in the plane of the flexible foil to stretch the flexible foil over an area positioned between the first and second pairs of air bearings. It also includes optically processing the flexible foil in the area.

This and other method implementations can include one or more of the following features.

In some implementations, the force in the plane of the flexible foil is induced, at least in part, by the first and/or second pairs of porous air bearings. The two pairs of air bearings can be used to induce tension in or movement of the flexible foil. Or, one of the pairs can cooperate with another force, such as source or take-up reel. Or, the air bearings can be neutrally configured to not impart force on the flexible foil.

When this application refers to stretching the flexible foil, this is not intended to require elastic or inelastic deformation. In this sense, stretching means applying a tension that would tend to cause a flattening of undulations present in the foil and to lessen sag between the pairs of bearings. The tension need not be so strong as to change the dimensions of the flexible foil.

In some implementations, the optical processing area of the flexible foil between the pairs of bearings is a writing area. In other implementations, optical processing operations on flexible substrate can include inspection, metrology, or optical characterization.

In some implementations, the width of the area between the first and second pairs of air bearings in the direction of feeding is one-fifth or less a length of the area in a crosswise direction. Or, it can be one-tenth or less a length of the area in a crosswise direction. The optical processing area form an arc, or it can be straight, as in a rectangle.

The method can further include scanning the area using a moving optical head travelling with at least 0.7 meters per second and isolating the surface of the flexible foil from aerodynamic disturbances created by a moving optical head using an aerodynamic barrier.

A different atmosphere composition than ambient can be supplied in a compartment formed between the aerodynamic barrier and the flexible foil. For instance, a noble gas could be used.

The method can further include using a fast focus system with a responsiveness of 100 Hz or higher to follow any non-flatness or vibrations of the stretched foil.

In some implementations, the optical processing that takes place in the optical processing area is patterning through exposure to radiant energy or electromagnetic energy.

In some implementations, the optical processing that takes place in the optical processing area is inspection by imaging on an image detector.

In some implementations, applying the stretching force further involves separating the upper and lower bearings of the second pair of porous air bearings by an asymmetrical clearance to induce an advancing force in the plane of the foil.

In some implementations, applying the stretching force further includes separating the upper and lower bearings of the second pair of porous air bearings by an asymmetrical clearance to induce an advancing force in the plane of the foil and separating the upper and lower bearings of the first pair of porous air bearings by an asymmetrical clearance to induce an retarding force in the plane of the foil.

The method can further include applying a squeezing force perpendicular to the direction of feeding to one or more of the porous air bearings to produce the stretching force. The second pair of air bearings can be curved so as to produce forces that stretch the flexible foil in a direction transverse to the direction of feeding.

In some implementations, applying the stretching force further includes squeezing the second pair of porous air bearings asymmetrically to produce an advancing force in the plane of the foil and squeezing the first pair of porous air bearings asymmetrically to produce a retarding force in the plane of the foil. This implementation can further include measuring movement of the foil and using a feedback system to control the squeezing of at least one of the pairs of air bearings. It can further include measuring the movement of the flexible foil by reading a pattern from along edges of the flexible foil. It can further include forming at least one loop of the flexible foil before the first pair of air bearings. The loop can be a variable feed loop that isolates a first rate of movement of the flexible foil upstream of the loop from a second rate of movement of the flexible foil between the first and second air bearings.

Some implementations further include measuring distortion in the flexible foil using at least two cameras positioned prior to a processing part of the area and at least two cameras after the processing part. The method can further include calculating a local coordinate system covering the area and aligning the writing of the pattern to the local coordinate system, thereby compensating for the distortion of the flexible foil. The distortion can be created by the feeding of the flexible foil. It can be created by deformation of the flexible foil. It can be compensated by modification of the optical system.

In some implementations, the patterning is done by a direct-writing system having a datapath, and the patterning is aligned by modification of data in the datapath.

In some implementations, electronic devices are formed on the flexible foil by the patterning.

Some implementations further include supplying the flexible foil in a roll-to-roll configuration.

Some implementations further include supplying the flexible foil as cut sheets.

Another implementation is described as a method of feeding a flexible foil through a writing area, the method including passing a first segment of the flexible foil through a first pair of lower and upper air bearings and inducing a first resistive force on the flexible foil due to air from the air bearings passes over the first segment of the flexible foil. The method further includes passing a second segment of the flexible foil over a second pair of lower and upper air bearings and inducing a first advancing force on the flexible foil due to air from the air bearings passes over the second segment of the flexible foil. Practicing this method, the first advancing force is greater than the first resistive force, thereby inducing movement of the flexible foil from the first pair of air bearings towards the second pair of air bearings. As above, this method optionally includes writing a pattern on the flexible foil in a writing area, wherein the writing area is positioned between the first and second pairs of air bearings.

These methods and implementations can include one or more of the following features:

The second pair of air bearings can induce a tension in the flexible foil generally perpendicular to the movement of the flexible foil from the first pair of air bearings towards the second pair of air bearings.

The methods can include passing a pre-first segment of the flexible foil over a third pair of lower and upper air bearings and forming a variable feed loop that isolates a first rate of movement of the flexible foil upstream of the third pair of air bearings from a second rate of movement of the flexible foil between the first and second air bearings.

The methods can include isolating a surface of the flexible foil between the first and second air bearings from aerodynamic disturbances caused by a writing mechanism moving near the writing area.

The methods can include sensing the movement of the flexible foil and reconfiguring at least one of the first or second pair of air bearings to change force applied to the flexible foil based at least in part on the sensed movement of the flexible foil.

The methods can include sensing force exerted on the flexible foil in the writing area and reconfiguring at least one of the first or second pair of air bearings to change force applied to the flexible foil based at least in part on the sensed force.

The technology described above as methods and features of methods also can be practiced as computer program instructions stored on computer readable memory that, when executed on a processor, cause a system to vary clearances between air bearings practicing any of the methods described herein or as computer program instructions stored on computer readable memory that, when loaded onto a suitable system, complete any system as described herein.

One device implementation describes a flexible foil feed system. This system includes a first pair of lower and upper porous air bearings defining a first feed path portion for a flexible foil and a second pair of lower and upper porous air bearings defining a second feed path portion for the flexible foil. In this implementation, the system applies a force in the plane of the flexible foil. The force stretches the flexible foil over an optical processing area positioned between the first and second pairs of air bearings (understanding the meaning of stretch given above.)

This device implementation can generally practice features and aspects of the method implementations described above. Devices practicing the technology disclosed also can include one or more of the following features:

In some implementations, a writing head that flies over the optical processing area between the first and second pairs of air bearings. In some implementations, a reading head that flies over the optical processing optical processing area between the first and second pairs of air bearings.

The system can further include a controller and a pattern writing head positioned to write a pattern in the optical processing area between the first and second pairs of air bearings. It can include at least four cameras, two before and two after the optical processing area, that capture images of the flexible foil and cooperate with a controller to control feeding of the flexible foil. The controller can use measured positions of the marks on the flexible foil to calculate a local coordinate system covering the optical processing area and use the local coordinate system to write the pattern.

The system can further include an aerodynamic barrier that isolates the surface of the flexible foil in the optical processing area from aerodynamic disturbances caused by the writing mechanism. This can be applied when the writing mechanism has a speed relative to the flexible foil of greater than or equal to 0.7 meters per second.

Another implementation describes a writing feed system for a flexible foil. This system includes a first pair of lower and upper air bearings, a second pair of lower and upper bearings and a feed path from the first pair of air bearings to the second pair of lower and upper air bearings. In this system, a force is induced between the pairs of air bearings that tends to stretch or flatten the flexible foil. In some implementations, the system includes a writing area in which the flexible foil is exposed to radiant energy, wherein the writing area is positioned between the first and second pairs of air bearings.

This system implementation can include one or more of the following features.

The second pair of air bearings can be configured to induce a tension in the flexible foil generally perpendicular to the movement of the flexible foil from the first pair of air bearings towards the second pair of air bearings.

The system can include a third pair of lower and upper air bearings positioned upstream of the first pair of air bearings and controlled to form a variable feed loop in the flexible foil that isolates a first rate of movement of the flexible foil upstream of the third pair of air bearings from a second rate of movement of the flexible foil between the first and second air bearings.

The system can include an aerodynamic barrier positioned between a surface of the flexible foil in the writing area and a writing mechanism moving near the writing area, wherein the aerodynamic barrier isolates the surface of the flexible foil in the writing area from aerodynamic disturbances caused by the writing mechanism.

The system can include a plurality of sensors that sense the movement of the flexible foil through the writing area and a controller configured to modify clearances between lower and upper portions of at least one of the first or second pair of air bearings to change force applied to the flexible foil based at least in part on the sensed movement of the flexible foil.

The system can include a plurality of sensors that sense force exerted on the flexible foil in the writing area and a controller configured to modify clearances between lower and upper portions of at least one of the first or second pair of air bearings based at least in part on the sensed force.

Further system embodiments can be built from less than all of the features in the foregoing combination. For instance, one system implementation produces a dynamic deformation adaptation system. This implementation includes a writing slit area, in which a flexible foil is exposed to writing. It includes at least four cameras, two before and two after the writing slit area, which capture images of the flexible foil and cooperate with a controller to measure the position of marks on the flexible foil. The controller uses the measured position of the marks on the flexible foil to calculate a local coordinate system covering the writing slit area. Optionally, the system writes a pattern relative to the local coordinate system.

Another system implementation provides writing feed system for a flexible foil. The system includes an aerodynamic barrier positioned between a surface of a flexible foil in a writing area and a writing mechanism moving near the writing area. The aerodynamic barrier isolates the surface of the flexible foil in the writing area from aerodynamic disturbances caused by the writing mechanism. This aerodynamic barrier can be utilized in a variety of settings. It is considered particularly useful when the writing mechanism has a speed relative to the flexible foil of greater than or equal to 0.7 meters per second. At tip speeds in this range, a rotating mechanism or a shuttle mechanism is expected to create sufficient aerodynamic forces to at least occasionally deformed flexible foil in the absence of countermeasures.

In general, the features described above in connection with other systems also can be applied to this pair of further systems or to method counterparts. Either of these further system embodiments can be practiced as a method, as generally described above where features of these freestanding systems are described as features of other systems.

Aligning the Foil and the Written Patterns

When the technology is used for writing a pattern there can be a number of issues related to the alignment of the foil and the writing mechanism. In a writing system there is only one chance to adjust the position since the writing is a destructive operation, in contrast to metrology, inspection and surface characterization where alignment can be done repeatedly, iteratively or in software after the information has been captured. The first issue in patterning is to ensure that the feeding of the substrate to be pattern is well enough controlled to create a coordinate system that is accurate enough for the end product. For a color filter for an LCD, as an example, the coordinate system has to be good enough to fit to the transistor backplane. The accuracy has to fulfill specifications, sometimes tight specifications, both over long and short ranges. Transistors formed by the overlay of multiple patterned layers is an example were specifications are very tight.

The first layer to be printed has no guides or fiducials to align to and the coordinate system has to be created. Sheet-form material is normally written on a stage and the stage provides the necessary mechanical accuracy to form an accurate coordinate system and an accurately written pattern. A writer where a thin foil is fed through the writing mechanism cannot get the precision from the movement of a precision stage. In this application we are providing the foil, typically running from roll to roll has an alignment track along the edges. The track consists of features or structures which are optically detectable. A camera at each edge is looking at the track, analyzing the image to determine the position of the track and thereby the position of the foil. The position of the track/foil can be accurately calculated from the camera image of the track and the speed of movement from how the image wanders over the camera field between pictures. Having two cameras seeing the same mark sequentially but with a known distance between them allows the speed to be calculated much more accurately and the combined cameras can provide feedback information to a highly feeding system. The cameras can also provide sideways information, allowing the foil to be fed in a straight line, and if the same foil is loaded into the writer a second time the movement can be controlled to be extremely close to the movement the first time. This may be used for two-pass writing or for writing of multiple pattern layers like in a transistor backplane.

An element of the invention is that the tracks need not be formed with high precision, only that they can be recognized and the position calculated between two positions in the same field, between two cameras or when fed twice through the system. A second element is that the tracks are continuous or semi continuous in the sense that when the foil is fed there is always enough structures of the track in the camera field so that the position of the track can be determined. If for example the track consists of a regular sequence of dots, rings, or crosses and the distance between structures in the feeding direction is less than one camera field there will always be one dot, ring, or cross that is visible in the camera image. Denser tracks with more features provide better signal-to-noise because there are more feature edges in the image and the position of features can be averaged over more features.

Figure 8A:
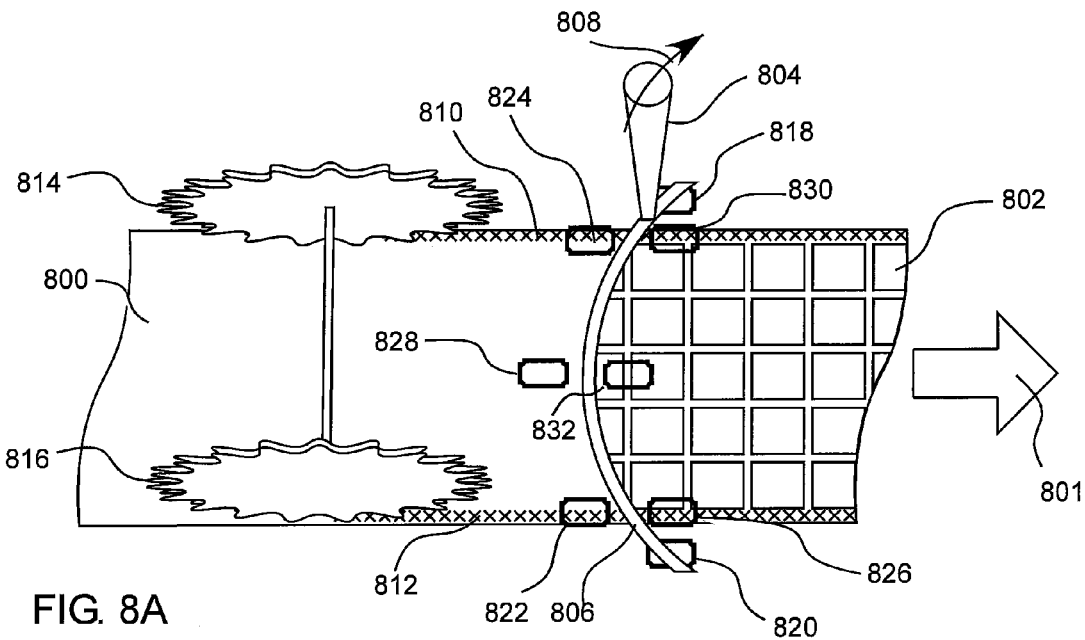
FIGS. 8A-8B shows how the movement of the foil may be controlled.

The tracks may be formed during manufacturing of the foil, but in many cases it may be more practical to form them before writing the first layer. In pending U.S. application Ser. No. 12/718,903 filed 5 Mar. 2010 by the same assignee, fiducials are done by mechanical indenting. The alignment camera reads the fiducials which do not have the required position accuracy, store the location of them, and recognize them later in order to align a second writing pass to the first writing pass by placing them at the same positions. The indentations form immediately visible marks which can be captured and analyzed without processing. It is an element of the current invention that tracks with marks are formed that are immediately visible to the camera, the position of the marks are determined by the camera, or generally by an optical sensor, and captured and determined again to find measure the position or movement of the foil. The position may be recorded and stored for alignment of the foil in a subsequent writing operation. An example embodiment is shown in FIG. 8A. The foil 800 is fed in the direction 801 through a writing mechanism 804. FIG. 8A shows an example of a circular scan 806, 808 of a writing beams (a collection of many beams) 804. The writing mechanism exposes a pattern on the foil. The pattern may be created by exposure of a photoresist, other chemical changes of the surface, ablation, laser induced forward transfer, selective annealing, etc. Some of these methods, e.g. exposure of photoresist, creates a pattern that is not optically visible until after development. At the edges of the foil are first cameras 824 and 822 (the image fields shown). They capture images of optically visible tracks 810, 812 and store information about the position of the marks of the tracks. Subsequent images show the same marks shifted in the camera fields and an approximate velocity of the foil can be calculated. One or two second cameras 830, 826 take images farther along the path of the foil and a much more exact velocity can be calculated. The driving of the foil is controlled so that a desired speed of the foil is maintained with high precision. In this way a steady smooth precision movement of the foil in the drive direction 801 is created. The first 824, 822 and second 830, 826 cameras also give sideways position of the foil and its sideways position can be accurately maintained. The cameras (or detectors), the tracks, and the algorithms in combination act to create continuously available position information (both x and y).

FIG. 8A shows an example embodiment of creating tracks 810, 812 which are optically visible. Two spur wheels 814, 816 with sharp points run against the foil and create two rows of sharp indentations to be used as fiducials or marks along the edges of the flexible foil or at least outside the writing area. The positional accuracy of the marks created by the spur wheels need not be very high, since their absolute positions are not used. They only form marks to measure relative changes in the foil, changes that may come from translation, shrinkage, and distortion.

A second issue is that the foil may expand or shrink during processing and subsequent patterns may need to be modified to align to previous patterns. The patterns are formed on the surface of the foil and follow the expansion or shrinkage of the foil. The changes in the foil may be very complex but typically the largest displacements of features come from simple distortions: isotropic shrinkage, anisotropic shrinkage (scale), and skewing (or orthogonality). These can be detected by the edge cameras 824, 822, 830 and 826. If the marks are too high in the top detector 824 and too low in the bottom detector 822 the foil has expanded in the vertical direction. If the first top camera 824 shows the marks to the right and the second top camera 830 shows them to the left, then the foil has contracted in the feed direction. If the first and second top detectors 824, 830 show the marks to the right and the bottom detectors 822, 806 show them to the left the foil is skewed. All these errors can be corrected during writing.

Figure 8B:
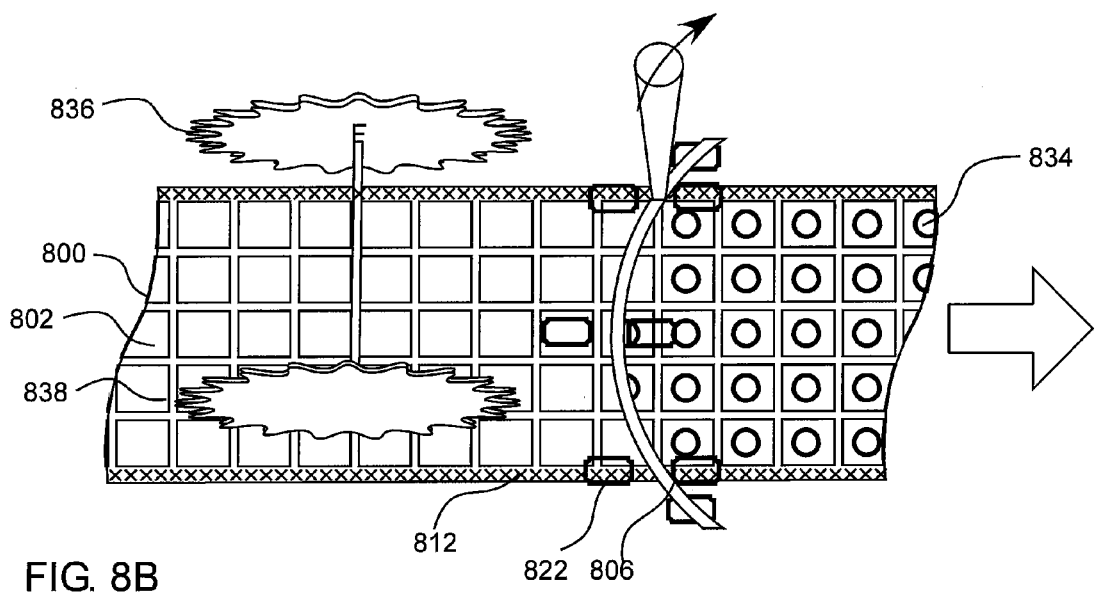
Figure 9B:
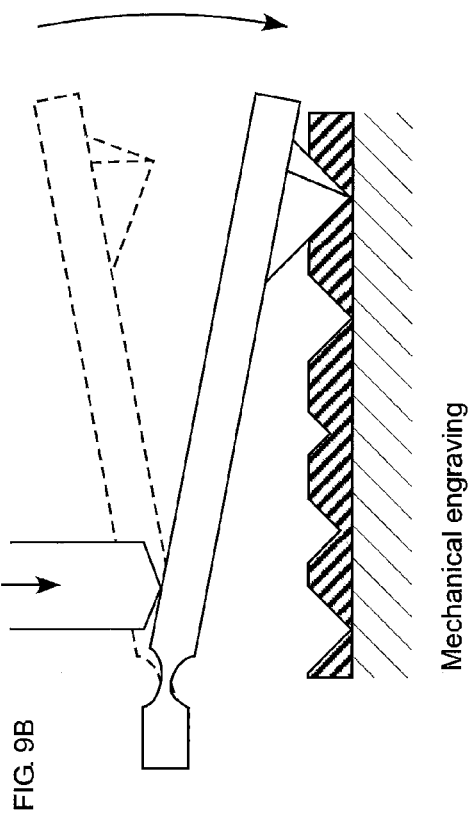
FIGS. 9A-9D shows example embodiments of creating alignment marks along the edge of the foil.
Figure 9A:
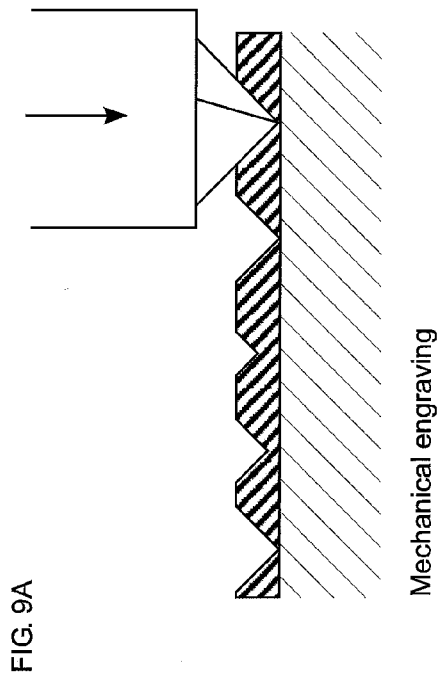
Figure 9D:
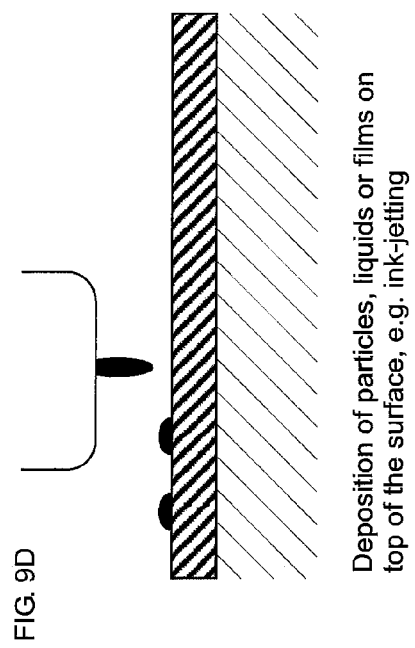
Figure 9C:
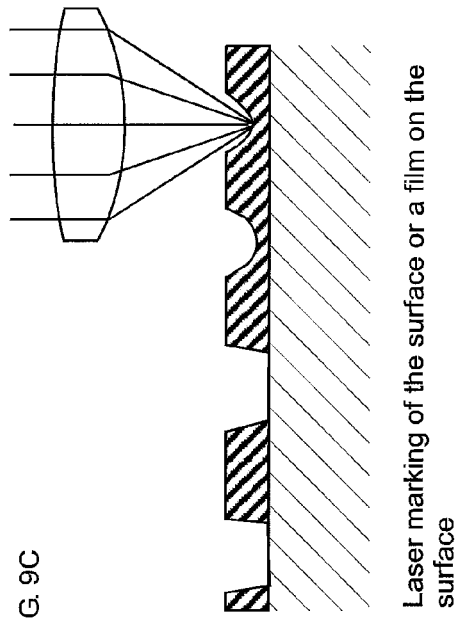

A third issue is that the foil may distort non-linearly, e.g. a straight line across the foil may become curved, one side may contract more than the other side, etc. This cannot be seen by the edge cameras and it cannot be detected (or have any importance) on a non-patterned film. FIG. 8B shows an example embodiment, which can provide information about such non-linear distortions. The figure shows the same writing system as in FIG. 8A but the spur wheels have been lifted not to provide any more indentations. At least one camera is placed in the interior of the foil. FIG. 8B shows two cameras and the fields of the edge cameras extending into the patterned area. The picture shows the same foil 800 as in FIG. 8A but in a subsequent writing operation. The features 802 formed by exposure in FIG. 8A are now visible and can be used for alignment. However, the pattern may be sparse. Aligning to only the pattern 802 would be vulnerable to the pattern visibility and density. Therefore the basic alignment is done using the same method as in FIG. 8A. The writing in FIG. 8A is repeated, but with a different pattern 834. In FIG. 8A the pattern was positioned in relation to the marks of the tracks 810, 812. Therefore the basic assumption is that they are positioned in the same way in relation to the same tracks 810, 812 in the second writing operation (FIG. 8B). The interior cameras 828, 832 and the edge cameras 824, 830, 822, 826, when they see features, can provide information about the non-linear distortion. FIG. 8A-8B show two internal cameras 828 and 832, but the number can be any positive number: one is minimum and a larger number of cameras increase the likelihood of catching features in the image and allow higher-order terms of the distortion to be captured and corrected for.

The correction algorithm may work like this: the first pattern 802 was written in a nominal or first coordinate system since no distortion is known or relevant for a non-patterned foil. At all times during the writing of the second layer 834 the edge cameras see the tracks and know the relative position of the foil to each camera. Thus can be calculated a second coordinate system using the information from the edge cameras taking into account translation, scale, and skewing. The datapath knows where, relative to the cameras, each of the first layer features is expected to be if there is no more distortion. When the pattern 802 runs under the cameras, and the cameras occasionally gets an image of a feature (assuming the features are sparse) and can calculate the actual position of it. The difference between the expected place and the actual position gives a local error. These local errors can be used to modify the second coordinate system into a third coordinate system which includes those non-linear distortions which can be measured with the number of cameras that are in use. The correction can be a two-dimensional polynomial, which is least-squares fitted to the local errors. In this way a local coordinate system can be created which gives improved second-layer alignment even in the presence of non-linear errors and with sparse layers.

FIGS. 3C-3G show an example how the correction can be done. The cameras 356, 358, 360, 362, 364, 366 are placed over the foil 350A. In the first writing pass FIG. 3C there is no pattern to see or align to and the writing optics and datapath write features 351 in a nominal undistorted first coordinate system 354A. In a second writing pass FIG. 3D the foil is distorted 350B. The cameras pick up the distortion from the position of the features 351, which have moved relative to the machine reference. A distorted coordinate system 354B is calculated which approximates the distortion of the foil and the distorted coordinate system 354B is used for writing the second pattern. Thereby the features written in the second pass are placed on top of the features in the first pass with good alignment. In FIG. 3E a third writing pass is done with a differently distorted foil 350C. Like in FIG. 3D a distorted coordinate system 354C is fitted to the distorted foil based on the position of the features 351 and the writing system correct for the distortion. FIGS. 3F and 3G show the distorted coordinate systems. For generality some of the features 351 may be written in the first pass and some may have been added to the foil previously, e.g. by indenting. Other methods of creating optically readable marks before processing that may be used is marking with a laser (laser marking, laser melting, laser ablation, laser induced forward transfer, etc.) or deposition of liquid drops or particles on the surface (e.g. by an ink-jet head), as shown in FIGS. 9A-D.

Another issue with controlling the accurate placement of written features is that the laser (or generally optical) beam may drift in relation to the machine frame of coordinates, e.g. due to heating, ageing, air pressure variations, laser replacement, etc. This may be solved by auxiliary detectors or cameras that the beam scans over and which are configured to show the position of the writing beam or rather the pattern written by the beam while scanning. A detector may for example be a camera and the beam writes a fiducial mark on the camera chip. The recorded image is analyzed digitally to extract the position of the written fiducial mark on the camera chip and drifts in the optical system are determined and corrected for during writing. The cameras may be positioned outside of the foil, e.g. at the ends of the written stripe as shown as 308, 310 in FIG. 3A and as 818, 820 in FIG. 8A. The beam power is reduced on the camera to bring the image within the dynamic range of the camera image sensor and to avoid permanent damage. Other example embodiments may have single detectors behind knife edges or behind more complex filters to increase the signal to noise ratio.

The position corrections that are determined from the beam detectors, the edge cameras and/or the cameras looking at a preexisting pattern on the foil can be applied to the writing operation in a number of ways. They can be applied to the optics such as a fast steering mirror or other moveable element; to the foil by changing the driving of the foil, stretching it, shifting it sideways, etc; to the driving electronics by adding time delays to the data, or to the datapath by modifying the data. The modification of the data may be done by resampling from the grid in one coordinate system to the grid in a second modified (typically rotated, scaled or distorted) coordinate system. The grids may have the same or different grid spacing. This has been described in previous patent applications by the same assignee.

Advantageous Effects

Flat, low friction surfaces influence the shape of the flexible foil as it passes through the writing area. Differential distances between surfaces of bearing pairs can be used to feed or retard movement of the flexible foil and to control feed alignment. Shaped bearing surfaces can apply some force to the flexible foil laterally, orthogonal to the direction of movement of the foil. Flatness can be improved. Deviations from flat and distortions in shape can be detected using sensors.

Industrial Applicability

The disclosure describes a variety of implementations of new technology. There is currently no established method of laser writing on roll-to-roll material with high resolution and alignment. Existing equipment uses a halfway solution of exposing rectangular areas from a mask and stepping the foil or a "quarter-way" solution of cutting the foil to sheets and laminating them to glass or silicon carriers. Potential advantages of roll-to-roll processing are low cost and large devices, both compromised by stepped processing and even more by the use of carriers. Together the technology disclosed here address many of the problems related to fast and accurate laser patterning, inspection and metrology on thin foils continuously fed from a roll or otherwise. It is believed that by applying the technology disclosed, an existing laser writer for sheet material can be converted to an industrially capable writer for roll-to-roll manufacturing of printed electronics, filling a large void in the nascent printed electronics industry.

The term air bearing is intended to stand for the broader class of gas bearings. It makes no difference to the function of the technology disclosed if the bearings are pressurized by another gas, such as nitrogen, argon, or carbon dioxide. Optical exposure may mean exposure by projection of a mask image or creating an image by an optical modulator driven by data from a datapath.

We claim as follows:

1. A method of holding a flexible foil with improved flatness while being fed in a direction of feeding, the method including:
    passing a first segment of the flexible foil between a first pair of lower and upper porous air bearings;
    passing a second segment of the flexible foil between a second pair of lower and upper porous air bearings;
    applying force in the plane of the flexible foil to stretch the flexible foil over an area positioned between the first and second pairs of air bearings; and
    writing a pattern on the flexible foil in the area;
    wherein applying the stretching force further comprises separating the upper and lower bearings of the second pair of porous air bearings by a clearance that varies along the direction of feeding in order to induce an advancing force in the plane of the foil.

2. The method of claim 1, wherein a width of the area between the first and second pairs of air bearings in the direction of feeding is one-fifth or less a length of the area in a crosswise direction.

3. The method of claim 2, wherein the area forms an arc.

4. The method of claim 1, wherein a width of the area between the first and second pairs of air bearings in the direction of feeding is one-tenth or less a length of the area in a crosswise direction.

5. The method of claim 1, further including:
    scanning the area using a moving optical head travelling with at least 0.7 m/s; and
    isolating a surface of the flexible foil from aerodynamic disturbances created by the moving optical head using an aerodynamic barrier.

6. The method of claim 5, further including supplying a different atmosphere composition than ambient in a compartment formed between the aerodynamic barrier and the flexible foil.

7. The method of claim 1, further including using a fast focus system with a responsiveness of 100 Hz or higher to follow any non-flatness or vibrations of the stretched foil.

8. The method of claim 1, wherein applying the stretching force further comprises:
separating the upper and lower bearings of the first pair of porous air bearings by a clearance that varies along the direction of feeding in order to induce an retarding force in the plane of the foil.

9. The method of claim 8, further including applying a squeezing force perpendicular to the direction of feeding to one or more of the porous air bearings to produce the stretching force.

10. The method of claim 9, wherein the second pair of air bearings is curved so as to produce forces that stretch the flexible foil in a direction transverse to the direction of feeding.

11. The method of claim 8, wherein applying the stretching force further comprises:
measuring movement of the foil; and
using a feedback system to control the separating of at least one of the pairs of air bearings.

12. The method of claim 11, further including measuring the movement of the flexible foil by reading a pattern from along edges of the flexible foil.

13. The method of claim 11, further including forming at least one loop of the flexible foil before the first pair of air bearings.

14. The method of claim 13, wherein the one loop is a variable feed loop that isolates a first rate of movement of the flexible foil upstream of the loop from a second rate of movement of the flexible foil between the first and second air bearings.

15. The method of claim 1, further including:
measuring distortion in the flexible foil using at least two cameras positioned prior to a processing part of the area and at least two cameras after the processing part;
calculating a local coordinate system covering the area; and
aligning the writing of the pattern to the local coordinate system, thereby compensating for the distortion of the flexible foil.

16. The method of claim 15, wherein the distortion is created by the feeding of the flexible foil.

17. The method of claim 15, wherein the distortion is created by deformation of the flexible foil.

18. The method of claim 15, wherein the distortion is compensated by modification of an optical system.

19. The method of claim 1, wherein electronic devices are formed on the flexible foil by the patterning.

20. The method of claim 1, further comprising supplying the flexible foil in a roll-to-roll configuration.

21. A flexible foil feed system, including:
a first pair of lower and upper porous air bearings defining a first feed path portion for a flexible foil; and
a second pair of lower and upper porous air bearings defining a second feed path portion for the flexible foil, wherein the second pair of porous air bearings are separated by a clearance that varies along a direction of the second feed path;
wherein a force in the plane of the flexible foil is applied that stretches the flexible foil over an area positioned between the first and second pairs of air bearings, and induces an advancing force in the plane of the foil.

22. The system of claim 21, further including a writing head that flies over the area between the first and second pairs of air bearings.

23. The system of claim 21, further including:
a controller;
a pattern writing head positioned to write a pattern in the area between the first and second pairs of air bearings; and
at least four cameras, two before and two after the area, that capture images of the flexible foil and cooperate with a controller to control feeding of the flexible foil;
wherein the controller uses measured positions of marks on the flexible foil to calculate a local coordinate system covering the area; and
wherein the controller uses the local coordinate system to write the pattern.

24. The system of claim 23, further including:
wherein an aerodynamic barrier isolates the surface of the flexible foil in the area from aerodynamic disturbances caused by the writing mechanism; and
wherein a writing mechanism has a speed relative to the flexible foil of greater than or equal to 0.7 meters per second.

* * * * *